United States Patent
Jang et al.

(10) Patent No.: US 12,219,281 B2
(45) Date of Patent: Feb. 4, 2025

(54) IMAGE SENSOR, IMAGE SENSING DEVICE INCLUDING SAME, AND OPERATING METHOD

(71) Applicant: SAMSUNG ELECTRONICS CO., LTD., Suwon-si (KR)

(72) Inventors: Chan Young Jang, Pohang-si (KR); Hee Kang, Hwaseong-si (KR); Jong Min You, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/460,388

(22) Filed: Aug. 30, 2021

(65) Prior Publication Data
US 2022/0201237 A1    Jun. 23, 2022

(30) Foreign Application Priority Data
Dec. 23, 2020  (KR) .................. 10-2020-0181920

(51) Int. Cl.
| | | |
|---|---|---|
| *H04N 25/772* | (2023.01) | |
| *H03M 1/14* | (2006.01) | |
| *H03M 1/56* | (2006.01) | |
| *H04N 25/60* | (2023.01) | |
| *H04N 25/771* | (2023.01) | |

(52) U.S. Cl.
CPC .......... *H04N 25/772* (2023.01); *H03M 1/141* (2013.01); *H03M 1/56* (2013.01); *H04N 25/60* (2023.01); *H04N 25/771* (2023.01)

(58) Field of Classification Search
CPC ............... H04N 5/37455; H04N 5/357; H04N 5/37452; H04N 5/378; H04N 5/3745; H04N 5/379; H03M 1/141; H03M 1/56; H03M 1/1295; H01L 27/14605; H01L 27/14627
USPC .................................. 348/308; 241/155–172
See application file for complete search history.

(56) References Cited

U.S. PATENT DOCUMENTS

| | | | |
|---|---|---|---|
| 6,633,335 B1 * | 10/2003 | Kwon ................. | H03M 1/1071 341/169 |
| 7,148,832 B2 | 12/2006 | Wada et al. | |
| 7,982,925 B2 | 7/2011 | Kato et al. | |
| 8,698,666 B1 | 4/2014 | Zhang et al. | |
| 8,718,147 B2 * | 5/2014 | Hickey ................ | H04N 19/507 358/1.9 |
| 11,122,188 B1 * | 9/2021 | Qiu .......................... | G06T 5/20 |
| 2007/0132864 A1 * | 6/2007 | Tsuruoka ............... | H04N 23/84 348/E5.079 |

(Continued)

FOREIGN PATENT DOCUMENTS

| | | |
|---|---|---|
| JP | 2012227892 A2 | 11/2012 |
| JP | 2015204583 A2 | 11/2015 |

(Continued)

*Primary Examiner* — Lin Ye
*Assistant Examiner* — Chan T Nguyen
(74) *Attorney, Agent, or Firm* — Sughrue Mion, PLLC (57) ABSTRACT

An image sensor includes; a pixel array disposed in a Bayer pattern and including pixels which respectively generate electrical charge according to received light incident, and an analog logic configured to convert an analog signal output from at least one pixel among the pixels into a first digital code using analog-to-digital conversion, and convert the first digital code into a second digital code by adjusting low-order bits of the first digital code in response to a control signal.

16 Claims, 7 Drawing Sheets

(56) References Cited

U.S. PATENT DOCUMENTS

| | | | |
|---|---|---|---|
| 2007/0297025 A1* | 12/2007 | Kato | H04N 25/00 |
| | | | 358/482 |
| 2008/0018502 A1* | 1/2008 | Wegener | H03M 7/30 |
| | | | 341/50 |
| 2010/0231426 A1* | 9/2010 | Van Der Vleuten | |
| | | | H04N 19/126 |
| | | | 341/107 |
| 2014/0028326 A1* | 1/2014 | Kawabata | H03M 1/002 |
| | | | 341/145 |
| 2017/0353728 A1* | 12/2017 | Huang | H04N 19/176 |
| 2018/0027202 A1* | 1/2018 | Ishii | H04N 3/1556 |
| | | | 348/308 |
| 2019/0379849 A1 | 12/2019 | Kim et al. | |
| 2021/0074027 A1* | 3/2021 | Higginbottom | G06T 3/40 |
| 2021/0227162 A1* | 7/2021 | Nonoshita | H04N 25/78 |

FOREIGN PATENT DOCUMENTS

| | | | |
|---|---|---|---|
| JP | 2018056711 A2 | 4/2018 | |
| JP | 2019140543 A2 | 8/2019 | |

\* cited by examiner

IMAGE SENSOR, IMAGE SENSING DEVICE INCLUDING SAME, AND OPERATING METHOD

This application claims priority from Korean Patent Application No. 10-2020-0181920 filed on Dec. 23, 2020 in the Korean Intellectual Property Office, the subject matter of which is hereby incorporated by reference.

BACKGROUND

1. Field of the Disclosure

The inventive concept relates generally to image sensors.

2. Description of the Related Art

An image sensing device may be used in various electronic devices, including mobile devices such as smartphones, tablets, digital cameras, and the like. The image sensing device may include a two-dimensional arrangement of pixels configured to generate an analog, electrical signal corresponding to the intensity (or brightness) of incident electro-magnetic energy (e.g., visible light). Thereafter, an analog-to-digital converter (ADC) may be used to convert the analog signal into a corresponding digital signal.

Representative image sensors include the charge coupled device (CCD) and the complementary metal-oxide semiconductor (CMOS) image sensor. The CCD exhibits low noise and excellent image quality compared to the CMOS image sensor. However, the CMOS image sensor has a simple driving method and may be implemented using a variety of scanning methods. Further, the CMOS image sensor may be readily integrated with a signal processing circuit on a single semiconductor chip. This ability enables a physical downsizing the constituent electronic device, and the CMOS process technology may be used interchangeably with existing product fabrication lines to reduce overall manufacturing costs. The CMOS image sensor also operates with relatively low power consumption which allows practical application within a broad range of mobile devices.

The CMOS image sensor includes an ADC configured to convert an analog image signal into a corresponding digital signal. A pixel array of the image sensor generally includes pixels arranged in a two-dimensional (2D) matrix (e.g., rows and columns), wherein each pixel outputs an image signal corresponding to received incident light. In this regard, each of the pixels accumulates photo charge corresponding to the level of incident light through a photodiode and outputs a pixel signal as analog current that varies in relation to the accumulated photo charge. It is this analog pixel signal that may be converted into a corresponding digital signal using the ADC. Accordingly, a number of ADC circuits is required, usually equal to a number of column lines in the pixel array.

In various applications of the CMOS image sensor, various signal processing techniques may be used to generate a high-quality image signal.

SUMMARY

Embodiments of the inventive concept provide image sensing devices capable of reducing power consumption of digital logic.

Embodiments of the inventive concept provide an image sensing device capable of operating with reduced overall power consumption while maintaining an acceptable signal-to-noise ratio (SNR) and image quality.

In one aspect, an embodiment of the inventive concept provides an image sensor including a pixel array disposed in a Bayer pattern and including pixels which respectively generate electrical charge according to received light incident, and an analog logic configured to convert an analog signal output from at least one pixel among the pixels into a first digital code using analog-to-digital conversion, and convert the first digital code into a second digital code by adjusting low-order bits of the first digital code in response to a control signal.

In another aspect, an embodiment of the inventive concept provides a method of operating an image sensing device. The method includes generating an analog signal corresponding to electrical charge generated in response to incident light using at least one pixel, converting the analog signal from an output line of the at least one pixel to generate a first digital code, and adjusting low-order bits of the first digital code in response to a first control signal to generate a second digital code.

In another aspect, an embodiment of the inventive concept provides an image sensing device including; a lens receiving incident light, a pixel array including pixels configured to generate electrical charge in response to the incident light and output an analog signal corresponding to the electrical charge, a row decoder configured to activate at least one of the pixels, first logic configured to receive the analog signal from an output line of the pixel activated by the row decoder and convert the analog signal into an N-bit first digital code, second logic configured to process an N-bit second digital code to output image data, and a control circuit configured to control operation of the first logic and the second logic, wherein the second digital code includes remaining (N-k) high-order bits other than k low-order bits of the first digital code, N and k being natural numbers, and N being greater than k.

However, noteworthy aspects and features of the inventive concept are not limited to only those explicitly described herein, and those skilled in the art will recognize other aspects, features and technical benefits upon consideration of the following detailed description.

BRIEF DESCRIPTION OF THE DRAWINGS

The above and other aspects and features of the inventive concept will be fully appreciated upon consideration of several exemplary embodiments described in relation to the accompanying drawings, in which.

DETAILED DESCRIPTION

Throughout the written description and drawings, like reference numbers and labels are used to denote like or similar elements and/or features. Terms such as "unit," "module," and the like used in the detailed description or functional blocks shown in the drawings may be variously implemented in hardware, software or a combination of hardware/software to perform the described functions.

Figure 1:
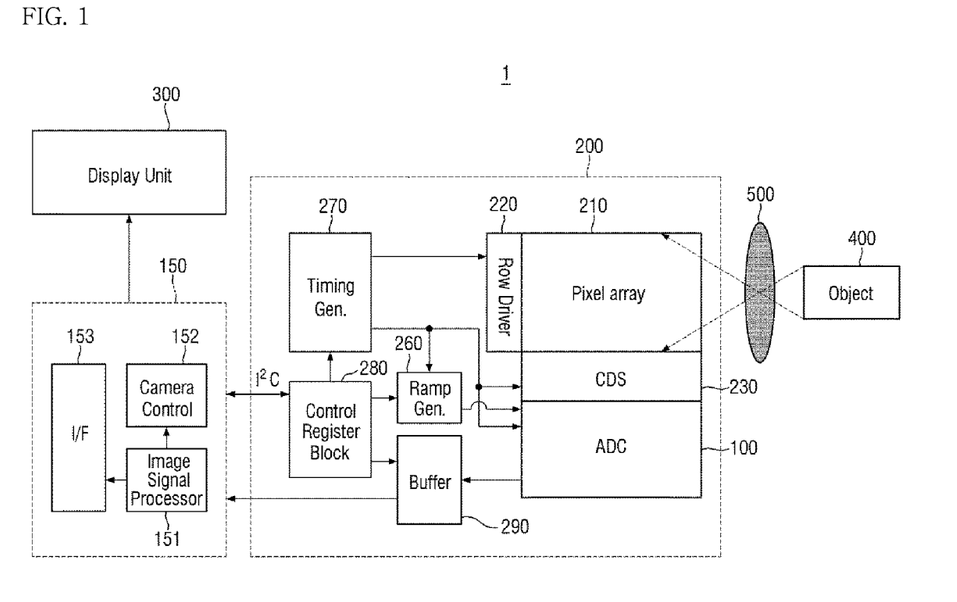
FIG. 1 is a block diagram illustrating an image sensing device 1 according to embodiments of the inventive concept.

Figure (FIG. 1 is a block diagram illustrating an image sensing device 1 according to embodiments of the inventive concept.

Referring to FIG. 1, the image sensing device 1 may be variously implemented as a portable electronic device such as a digital camera, a camcorder, a mobile phone, a smart phone, a tablet personal computer (PC), a personal digital assistant (PDA), and a mobile Internet device (MID), a wearable computer, an Internet of things (IoT) device, or an Internet of everything (IoE) device.

In some embodiments, the image sensing device 1 may include a display unit 300, a digital signal processor (DSP) 150, and an image sensor 200 (e.g., a CMOS image sensor).

The image sensor 200 may include a pixel array 210, a row driver 220, a correlated double sampling (CDS) block 230, and an analog digital converter (ADC) 100, a ramp generator 260, a timing generator 270, a control register block 280, and a buffer 290.

In this regard, the image sensor 200 may be used to image (or sense) an object 400 through a lens 500 under the control of the DSP 150. Here, the DSP 150 may output an image sensed by the image sensor 200 to the display unit 300.

In some embodiments, the image sensor 200 may receive a raw image from the pixel array 210 and perform analog binning using the ADC 100 and the buffer 290 to output the binned image to the display DSP 150.

The display unit 300 includes device(s) capable of outputting or displaying an image. For example, the display unit 300 may be a computer, a mobile communication device, and other image output terminals.

The DSP 150 includes a camera control 152, an image signal processor (ISP) 151, and an interface (I/F) 153.

The camera control 152 may be used to control the operation of the control register block 280. The camera control 152 may control the operation of the image sensor 200, that is, the control register block 280 using an inter-integrated circuit (I2C), but the scope of the inventive concept is not limited thereto.

The ISP 151 receives image data output from the buffer 290, processes or treat the received image data so that humans can easily see the data, and outputs the processed or treated image data to the display unit 300 through the I/F 153.

In some embodiments, the ISP 151 may process the image data output from the image sensor 200. The ISP 151 may output a digital binned image to the display unit 300 as a final binning image. In this case, the image output from the image sensor 200 may be a raw image from the pixel array according to some embodiments, or may be the binned image according to some embodiments. Although various embodiments are possible, for convenience of description in the present written description, it is assumed that the image data is output from the image sensor 200.

Although the embodiment illustrated in FIG. 1 shows the ISP 151 located in the DSP 150, the ISP 151 may otherwise be located in the image sensor 200 in other embodiments of the inventive concept. In some embodiments, the image sensor 200 and the ISP 151 may be implemented as a single semiconductor package (e.g., a multi-chip package (MCP)).

The pixel array 210 includes pixels arranged in a matrix (e.g., including rows and columns). Each of the pixels may include a photo-sensing device (or photoelectric conversion device) and a readout circuit which outputs a pixel signal (e.g., an analog signal) corresponding to electrical charge generated by the photo-sensing device. The photo-sensing device may be implemented as, for example, a photodiode or a pinned photodiode.

The row driver 220 may selectively activate each of the pixels. For example, the row driver 220 may drive pixels implemented in the pixel array 210 in units of rows. For example, the row driver 220 may generate control signals capable of controlling the operation of the pixels included in each one of the rows.

The pixel signal output from each of the pixels may be transmitted to the CDS block 230 in response to various control signal(s).

Thus, the CDS block 230 may include multiple CDS circuits. In some embodiments, each of the CDS circuits may perform correlated double sampling on pixel values respectively output by column lines implemented in the pixel array 210 in response to at least one switch signal output from the timing generator 270, and may compare the correlated double-sampled pixel value and a ramp signal output from the ramp generator 260 to output corresponding comparison signals.

The ADC block 100 may convert each of the output comparison signals to digital signals and output a plurality of digital signals to the buffer 290.

The ramp generator 260 outputs a ramp signal Vramp to the CDS block 230. The ramp signal Vramp ramps from a reference level to be compared with a reset signal Vrst, rises to the reference level, and ramps again from the reference level to be compared with an image signal Vim.

The timing generator 270 may be used to control the operations of the row driver 220, the ADC block 100, the CDS block 230, and the ramp generator 260 under the control of the control register block 280.

In this regard, the control register block 280 may control the operation of the timing generator 270, the ramp generator 260, and the buffer 290 in relation to the DSP 150.

The buffer 290 may transmit the image data corresponding to the digital signals (e.g., the pixel array ADC outputs) provided by the ADC block 100 to the DSP 150.

Raw image data output from the pixel array 210 through the CDS block 230 and the ADC block 100 may be Bayer image data composed of a Bayer format. That is, Bayer image data may be processed using red, green and blue (RGB) format data by the ISP 151 and is output to the display unit 300.

Figure 2:
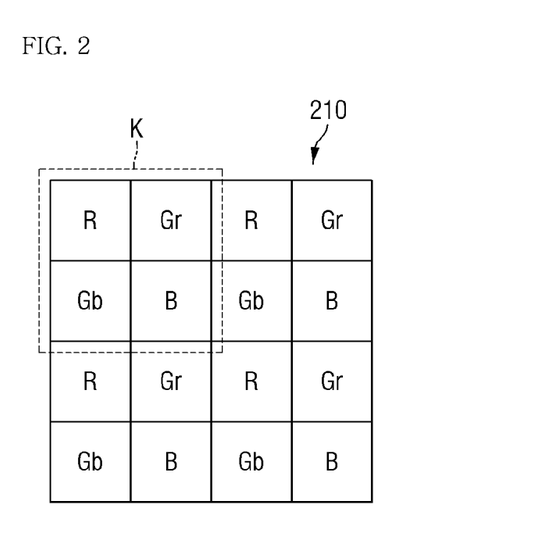
FIG. 2 is a conceptual diagram illustrating a portion of an exemplary pixel array according to embodiments of the inventive concept.
Figure 3:
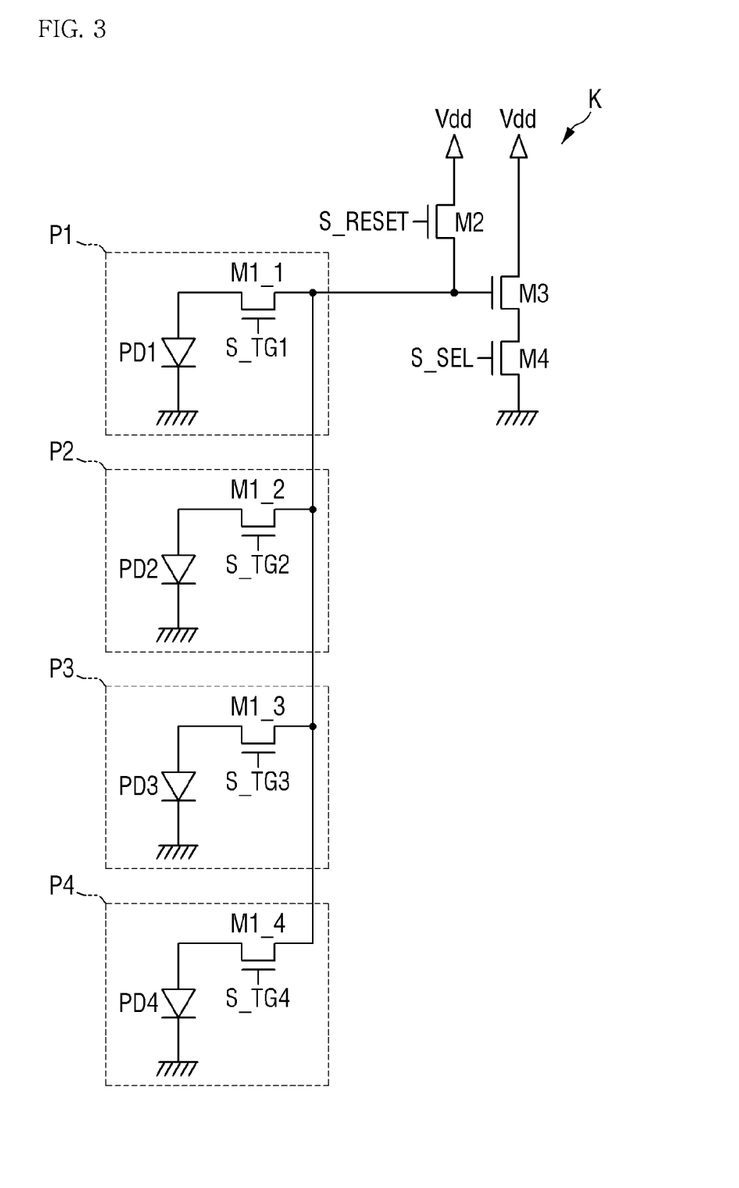
FIG. 3 is a circuit diagram illustrating in one example a pixel structure according to embodiments of the inventive concept.

FIG. 2 is a conceptual diagram illustrating a pixel array according to embodiments of the inventive concept, and FIG. 3 is a circuit diagram further illustrating in one example a pixel structure according to embodiments of the inventive concept.

Referring to FIG. 2, the pixel array 210 may be disposed in a Bayer pattern. The Bayer pattern includes a column in which R (red) and Gr (green) pixels are repeatedly disposed, and a column in which Gb (green) and B (blue) pixels are repeatedly disposed. Accordingly, the raw image also has a Bayer pattern image in which a row in which Gr pixels and R pixels are sequentially disposed, and a row in which B pixels and Gb pixels are sequentially disposed are alternately disposed.

The raw image may be operated in kernel units (K). The kernel may include at least one R (red) pixel, at least one Gr (green) pixel, at least one Gb (green) pixel, and at least one B (blue) pixel, according to some embodiments. Here, the raw image is expressed as a "kernel," which may be alternately referred to as a window or a unit according to other embodiments.

The exemplary kernel has a 2×2 size, but the scope of the inventive concept is not limited thereto and other embodiments of the inventive concept may use different sized kernels (e.g., 3×3, 2×4, 5×5, etc.).

Referring to FIG. 3, an individual pixel may include one or more photodiodes (e.g., PD1 to PD4), one or more transfer transistors (e.g., M1_1 to M1_4), a reset transistor (e.g., M2), a source follower transistor (e.g., M3), and a selection transistor (e.g., M4). Here, the various photodiodes may have different colors, or the same color.

Control signals S_TG1 to S_TG4, S_RESET, and S_SEL capable of respectively controlling the transistors M1 to M4 may be output from the row driver 220. An output signal of the selection transistor M4 is supplied to the column line.

In some embodiments, only one photodiode may be connected to the transistors M2, M3, and M4. The pixel includes one photodiode and one transfer transistor. Alternately, two or more photodiodes may share the transistors M2, M3, and M4. When two or more pixels share the transistors M2, M3, and M4, a size of the photodiode PD region may be increased without necessarily increasing the size of the entire pixel by sharing a floating diffusion region.

Figure 4:
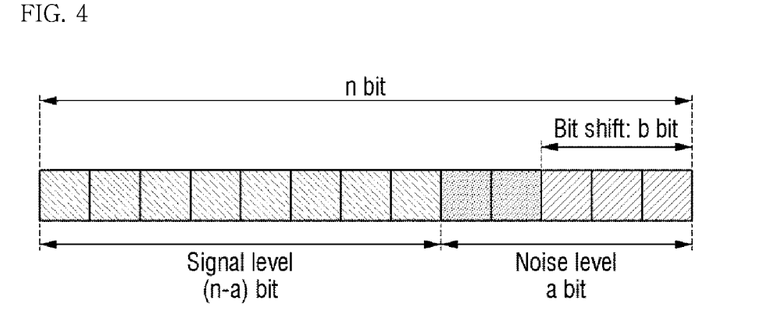
FIG. 4 is a conceptual diagram illustrating in one example an output signal that may be provided by an analog digital converter during operation of an image sensing device according to embodiments of the inventive concept.
Figure 5:
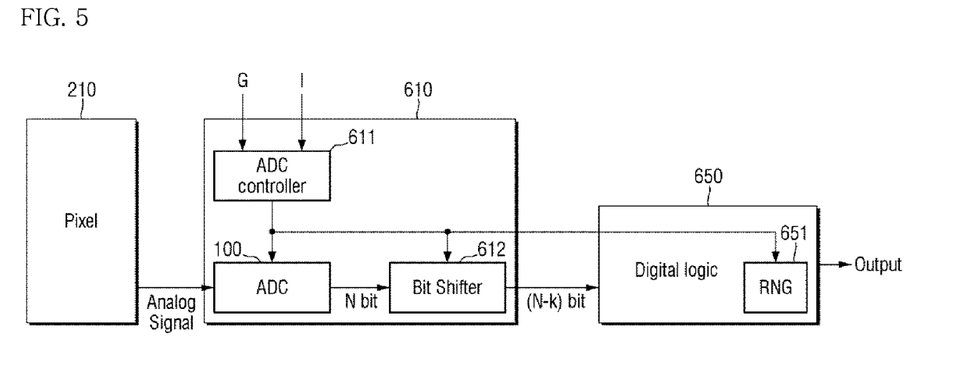
FIG. 5 is a block diagram illustrating in one example a peripheral circuit of an image sensor according to embodiments of the inventive concept.

FIG. 4 is a conceptual diagram illustrating in one example an output signal that may be provided by an analog digital converter during operation of an image sensing device according to embodiments of the inventive concept, and FIG. 5 is a block diagram illustrating in one example a peripheral circuit of an image sensor according to embodiments of the inventive concept.

Referring to FIGS. 4 and 5, when the analog signal is amplified, noise is also amplified. For example, when an analog signal to be input is converted to an N-bit signal, the noise among the N-bit signals may be assumed to occupy approximately a bit. When an analog gain is high during signal conversion, a noise level also becomes higher. That is, a signal-to-noise ratio (SNR) may be calculated as follows:

$$SNR = 20\log_{10}\left(\frac{2^n}{2^a}\right)20\log_{10}(2^{n-a}) \quad \text{[Equation 1]}$$

However, noise tends to be mainly distributed in a specific frequency band. Accordingly, when a region corresponding to the frequency band in which the noise signal is mainly distributed among the converted signals is partially clipped, a noise level may be reduced while maintaining the SNR as shown below:

$$SNR = 20\log_{10}\left(\frac{2^{n-b}}{2^{a-b}}\right)20\log_{10}(2^{n-\xi}) \quad \text{[Equation 2]}$$

For example, in one illustrated example, when the analog signal is n=13 bits and the noise level is 5 bits (a=5), 3 bits (b=3) are assumed to be clipped. When a first digital code (N=13) is 1010101110101, 3 low-order bits 101 may be clipped to remove noise and then 1010101110 (10 bits) may be output. In this case, since the signal level is maintained at 8 bits and only the noise level is reduced from 5 bits to 2 bits, only noise may be removed while maintaining the overall SNR.

In the image sensor, each of the pixel signals output from the pixel array 210 is input to an analog logic. The analog signal input to the analog logic is a signal in which the pixel signal is correlated double-sampled through the CDS block 230 as described in relation to FIG. 1, but is referred to as an analog signal for convenience of description.

The analog logic converts the analog signal output from at least one pixel among the pixels to a first digital code by analog-to-digital conversion, and the low-order bits (k) of the first digital code (N bits) according to the control signal may be adjusted to be converted to a second digital code (N-k bits). That is, the second digital code may be the remaining high-order bits in the first digital code, other than the low-order bits k.

In some embodiments, the low-order bits k to be clipped may be set differently for each color of the pixel array. In some embodiments, the low-order bits k to be clipped may be set differently according to a pixel position in the pixel array.

Referring to FIG. 5, analog logic 610 may include an ADC 100, an ADC controller 611, and a bit shifter 612. Although not shown here, according to some embodiments, the analog logic 610 may further include one or more of the peripheral circuits in the image sensor 200 of FIG. 1 (e.g., the row driver 220, the CDS block 230, the ramp generator 260, the control register block 280, the buffer 290, etc.).

The ADC 100 may receive analog signal(s) from at least one pixel output line associated with the pixels, amplify the analog signal(s) according to an analog gain, and then convert the analog signal(s) into a first digital code (e.g., including N bits, where 'N' is a natural number), and output the first digital code. In this case, the analog gain may be adjusted according to a control signal provided by the ADC controller 611.

Thus, the ADC controller 611 may generate the control signal by receiving a gain adjust signal and a user input signal.

The bit shifter 612 receives the first digital code (N bits), shifts k low-order bits, and outputs a resulting second digital code (N-k bits). In this case, is an integer greater than or equal to zero adjusted by the control signal based on the user input signal I. Here, the ADC controller 611 may be included, wholly or in part, within the ADC 100 in some embodiments, may be included, wholly or in part, within the control register block 280 in some embodiments, and/or may be included as a separate component within the image sensor 200 according to some embodiments.

A digital logic 650 may receive the second digital code (N-k bits), converts the second digital code to another code having N bits, and outputs this code. Thus, in some embodiments, the digital logic 650 may include a random bit generator (RNG) 651. The random bit generator 651 may be used to generate a number of random bits. Here, the number of random bits may be a number defined by the control signal based on the user input signal I, and may be the same as the number ('k') shifted by the bit shifter 612. That is, the digital logic 650 may output an N-bit "third digital code" by providing and including k random bits that essentially replace the number of low-order bits (e.g., the second digital code (N-k bits).

Figure 6:
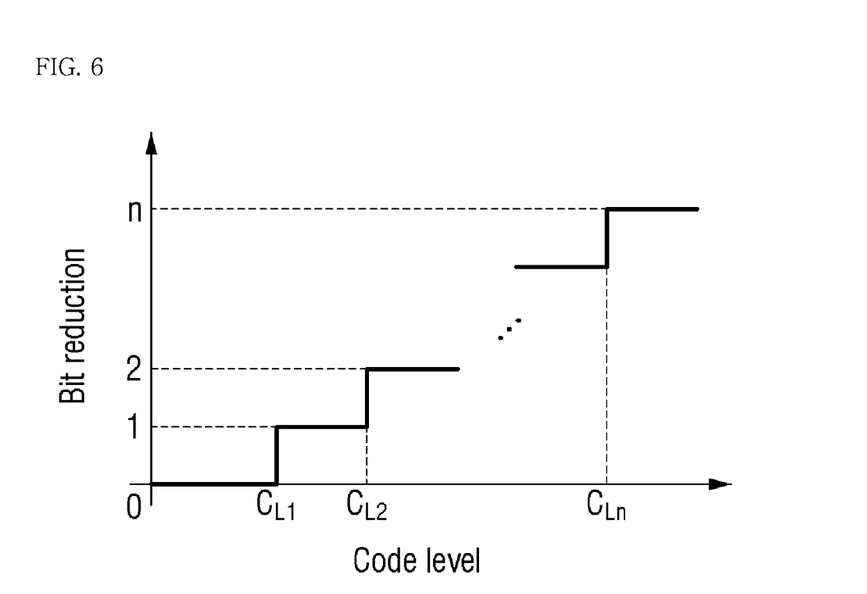
FIG. 6 is a graph illustrating a signal level-reduced number of bits in one example of operation of an image sensing device according to embodiments of the inventive concept.
Figure 7:
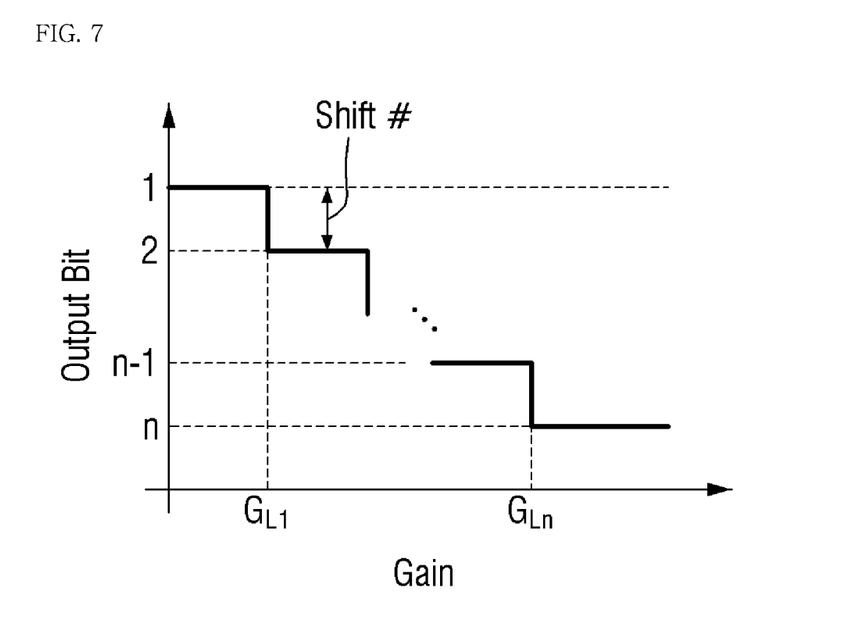
FIG. 7 is a graph illustrating a gain-output number of bits in one example of operation of an image sensing device according to embodiments of the inventive concept.

FIG. 6 is a graph illustrating a signal level-reduced number of bits describing the operation of an image sensing device according to embodiments of the inventive concept, and FIG. 7 is a graph illustrating a gain-output number of bits further describing the operation of the image sensing device according to embodiments of the inventive concept.

Referring to FIG. 6, when a gain level is low, the ADC controller 611 may adjust the number of bits to be clipped (k) according to the signal level. When the signal level of the analog signal is high, since the low-order bits of the converted first digital code mostly become noise, the effect of noise may be reduced by clipping some of the low-order bits of the first digital code.

Referring to FIG. 7, since the noise is amplified together with the signal as the gain level of the ADC 100 increases, the number of bits to be clipped (shift #) in the first digital code (output bits) may also increase.

That is, on the premise that the SNR is constant, the number of low-order bits to be clipped may also vary according to the number of bits of the first digital code. Consistent with Equation 1 above, since the noise level increases as the number of bits of the first digital code increases, the number of bits to be clipped (bit reduction) may also increase. As an example, in the case of a code level $C_{L2}$, two low-order bits may be clipped, or as another example, in the case of a code level $C_{Ln}$, n low-order bits may be clipped, and thus the noise level may be partially removed while maintaining the overall SNR.

As shown in relation to FIGS. 6 and/or 7, when the low-order bits are clipped, switching power of the transistor may be reduced when the digital logic 650 processes the clipped signal, that is, the second digital signal.

Figure 8:
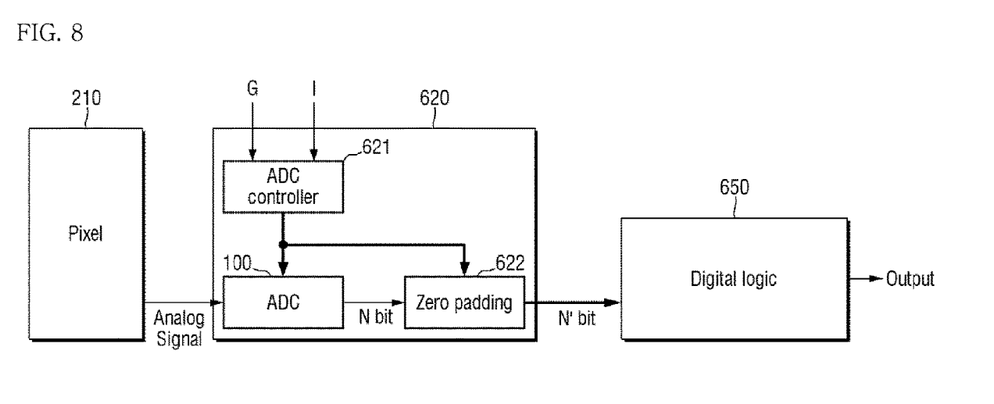
FIG. 8 is a block diagram illustrating a peripheral circuit of an image sensor according to embodiments of the inventive concept.

FIG. 8 is a block diagram illustrating in one example a peripheral circuit of the image sensor according to embodiments of the inventive concept.

Here, an analog logic 620 converts an analog signal output from at least one pixel among the plurality of pixels to a first digital code by analog-to-digital conversion, and low-order bits (k) of the first digital code (N bits) according to a control signal may be adjusted to be converted to a second digital code (N' bits).

Referring to FIG. 8, the analog logic 620 may include an ADC 100, an ADC controller 621, and a zero-padding unit 622. Although not shown, in some embodiments, the analog logic 620 may further include one or more of the peripheral circuits of the image sensor 200 of FIG. 1 (e.g., the row driver 220, the CDS block 230, the ramp generator 260, the control register block 280, the buffer 290, or the like).

The ADC 100 may receive the analog signal from at least one pixel output line among the pixels, amplify the analog signal according to an analog gain, and then convert the analog signal to the first digital code (N bits), and output the first digital code. In this case, the analog gain may be adjusted according to the control signal of the ADC controller 621.

The ADC controller 621 may generate the control signal by receiving a gain adjust signal and a user input signal.

The zero-padding unit 622 clips k low-order bits from the first digital code (N bit) (the second digital code) and pads k zeros (0) instead of the clipped low-order bits. That is, as many zeros as the number of low-order bits excluded from the first digital code may be padded and output as the third digital code. The analog logic 620 outputs the third digital code (N' bits) processed by the zero-padding unit 622. In this case, k is an integer greater than or equal to zero adjusted by the control signal based on the user input signal I.

The ADC controller 621 may be included, wholly or in part, within the ADC 100 according to some embodiments, may be included, wholly or in part, within the control register block 280 according to some embodiments, and/or may be included as a separate component in the image sensor 200 according to some embodiments.

Here, digital logic 650 digitally processes the third digital code (N' bit) to output a final digital signal. In contrast to the embodiment illustrated in FIG. 5, the digital logic 650 may not have a separate configuration for adding low-order bits.

Figure 9:
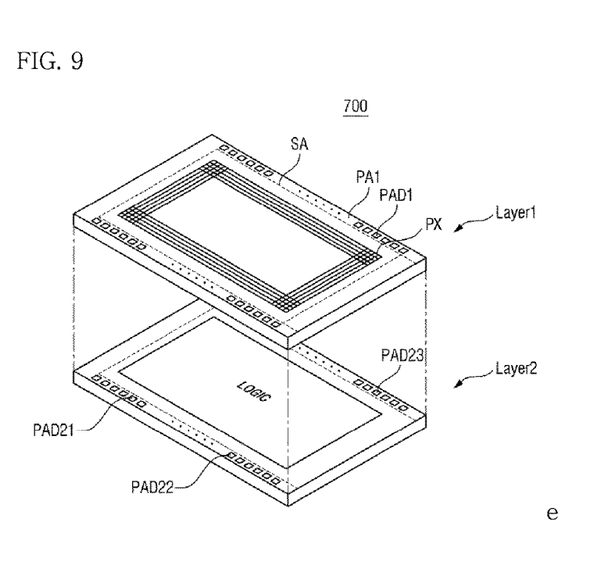
FIG. 9 is a perspective view illustrating an image sensor 700 that may be used in the image sensing device 1 of FIG. 1 as an alternative to the image sensor 200.

FIG. 9 is a perspective view illustrating an image sensor 700 that may be used in the image sensing device 1 of FIG. 1 as an alternative to the image sensor 200.

Referring to FIG. 9, the image sensor 700 may include a vertical stack of layers. Here, the pixel array 210 may be implemented in a first layer "Layer 1", and a remainder of the image sensor 200 (e.g., logic circuit "LOGIC") may be implemented in a second layer "Layer 2". The logic circuit "LOGIC" may include all the elements of the image sensor 200, except for the pixel array 210. That is, a pixel array region and a logic circuit region may be vertically stacked on a wafer level assuming a principal surface of the wafer corresponds to a horizontal plane.

The first layer "Layer 1" may include a sensing area SA, which includes the pixels PX, and a first pad area PA1, which is provided on the periphery of the sensing area SA. Upper pads PAD1 may be included in the first pad area PA1 and may be connected to the logic circuit "LOGIC" and pads PAD21 and pads PAD22 in a second pad area PA2 of the second layer "Layer 2" through vias.

In some embodiments, the pads PAD21 and the pads PAD22 may be input I/F pads, and pads PAD23 may be output I/F pads.

Figure 10:
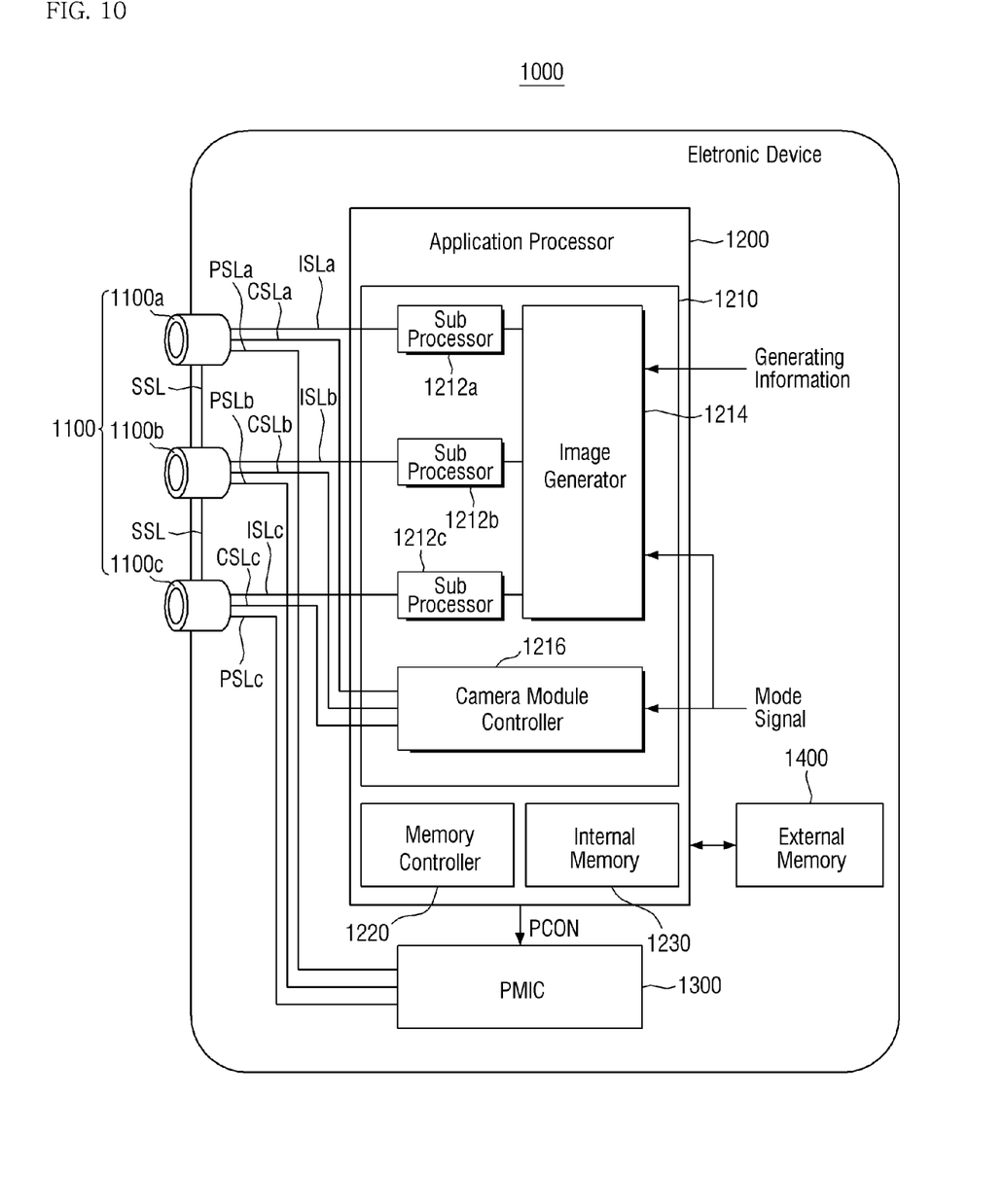
FIG. 10 is a block diagram illustrating an electronic device including a multi-camera module according to embodiments of the inventive concept.
Figure 11:
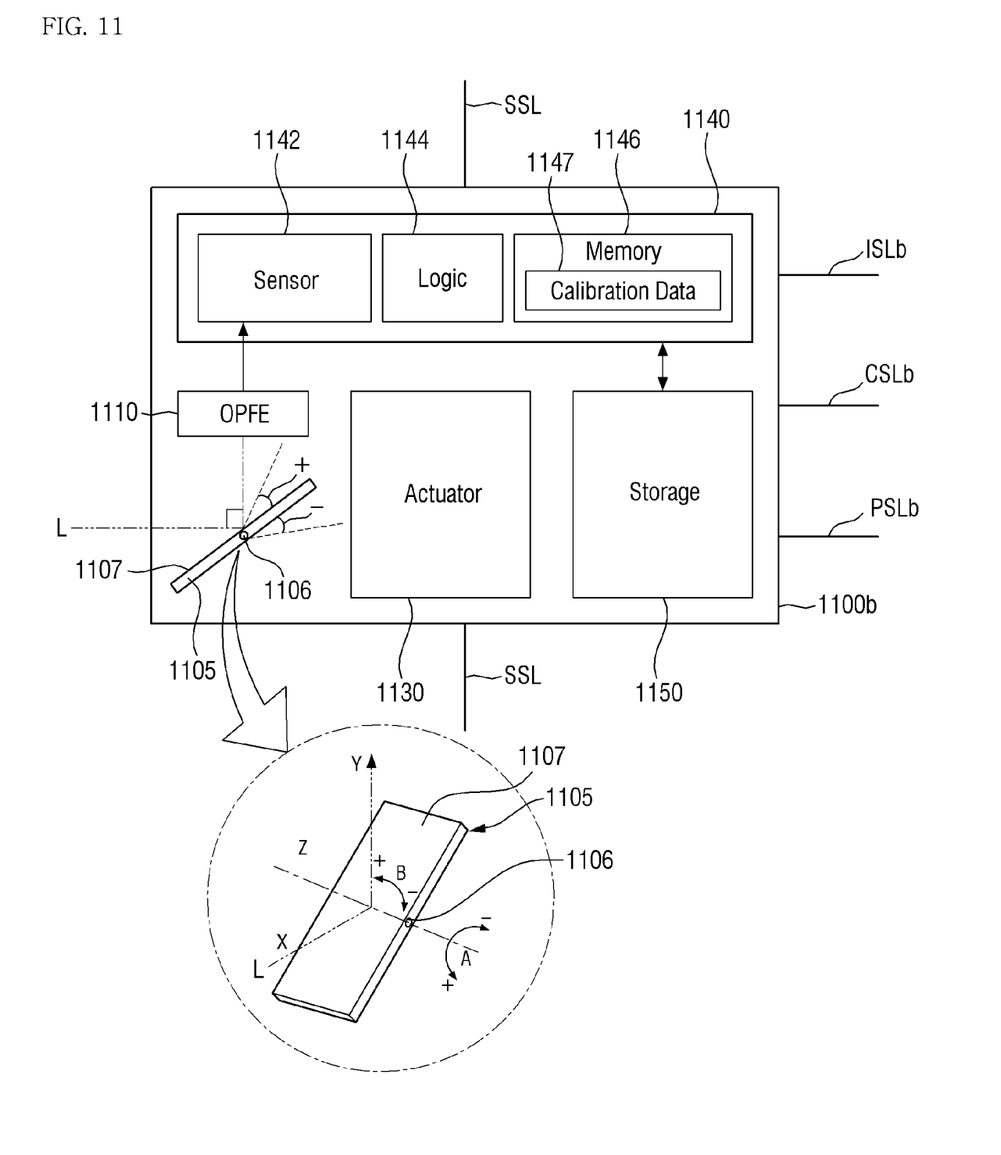
FIG. 11 is a block diagram further illustrating in one example the multi-camera module of FIG. 10.

FIG. 10 is a block diagram of an electronic device 1000 including a multi-camera module according to embodiments of the inventive concept, and FIG. 11 is a block diagram further illustrating the multi-camera module of FIG. 10.

Referring to FIG. 10, the electronic device 1000 may include a camera module group 1100, an application processor 1200, a power management integrated circuit (PMIC) 1300, and an external memory 1400.

The camera module group 1100 may include (e.g.,) camera modules 1100a, 1100b, and 1100c. Thus, FIG. 10 illustrates an example in which the camera module group 1100 includes three (3) camera modules, but the scope of the inventive concept is not limited thereto. Alternately, the camera module group 1100 may include two (2) camera modules, four (4) camera modules, etc.

An exemplary structure of the camera module 1100b will be described hereafter in relation to FIG. 11. The description that follows may be directly applicable to the other camera modules of the camera module group 1100, i.e., the camera modules 1100a and 1100c.

Referring to FIG. 11, the camera module 1100b may include a prism 1105, an optical path folding element (OPFE) 1110, an actuator 1130, an image sensing apparatus 1140, and a storage unit 1150.

The prism 1105 may include a reflective surface 1107 of a light-reflecting material and may thus change the path of incident light L received from an external source.

In some embodiments, the prism 1105 may change the path of the incident light L in relation to a first arbitrary direction X and a second direction Y substantially perpendicular to the first direction X. Also, the prism 1105 may change the path of the incident light L in the first direction X to the second direction Y by rotating the light L in an "A" motion and/or a "B" motion about a central axis 1106 of the reflective surface 1107. In this case, the OPFE 1110 may move in a third direction Z substantially perpendicular to the first and second directions X and Y.

In some embodiments, the maximum rotation angle of the prism 1105 may be 15 degrees or less in a "+A" motion and 15 degrees of greater in a "−A" motion, but the scope of the inventive concept is not limited thereto.

In some embodiments, the prism 1105 may move at an angle of about 20°, about 10° to 20°, or about 15° to about 20° in a "+B" motion or a "−B" motion. The angle by which the prism 1105 moves may be the same in both the "+B" motion and the "−B" motion or may be almost similar with a difference of only about 1°.

In some embodiments, the prism 1105 may move in the third direction Z, which is parallel to the direction in which the central axis 1106 of the reflective surface 1107 extends.

The OPFE 1110 may include, for example, a group of m optical lenses (where 'm' is a natural number). Here, the m optical lenses may be moved in the second direction Y to change the optical zoom ratio of the camera module 1100b. For example, if the default optical zoom ratio of the camera module 1100b is Z, the optical zoom ratio of the camera module 1100b may be changed to 3Z or 5Z (or greater) by moving the m optical lenses of the OPFE 1110.

The actuator 1130 may move the OPFE 1110 or an optical lens to a particular location. For example, the actuator 1130 may adjust the location of the optical lens such that an image sensor 1142 may be located at the focal length of the optical lens for a precise sensing.

The image sensing apparatus 1140 may include the image sensor 1142, a control logic 1144, and a memory 1146. The image sensor 1142 may sense an image of a target object using the incident light L provided via the optical lens. The control logic 1144 may control the general operation of the camera module 1100b. For example, the control logic 1144 may control the operation of the camera module 1100b in accordance with control signals provided via a control signal line CSLb.

The memory 1146 may store information necessary for the operation of the camera module 1100b, such as calibration data 1147. The calibration data 1147 may include information necessary for generating image data using the incident light L. The calibration data 1147 may include, for example, degree-of-rotation information, focal length information, and optical axis information. In a case where the camera module 1100b is implemented as a multi-state camera whose focal distance changes in accordance with the location of the optical lens, the calibration data 1147 may include focal distances for different locations (or different states) of the optical lens and autofocusing information.

The storage unit 1150 may store image data sensed by the image sensor 1142. The storage unit 1150 may be disposed on the outside of the image sensing apparatus 1140 and may be implemented as being stacked on a sensor chip that forms the image sensing apparatus 1140. In some embodiments, the storage unit 1150 may be implemented as an electrically erasable programmable read-only memory (EEPROM), but the inventive concept is not limited thereto.

Referring to FIGS. 10 and 11, in some embodiments, the camera modules 1100a, 1100b, and 1100c may include their own actuators 1130. The camera modules 1100a, 1100b, and 1100c may include the same calibration data 1147 or different calibration data 1147 depending on the operation of their own actuators 1130.

In some embodiments, one of the camera modules 1100a, 1100b, and 1100c, for example, the camera module 1100b, may be a folded lens-type camera module including the prism 1105 and the OPFE 1110, and the other camera modules, i.e., the camera modules 1100a and 1100c, may be vertical camera modules not including the prism 1105 and the OPFE, 1110. However, the scope of the inventive concept is not limited thereto.

In some embodiments, the camera module 1100c may be, for example, a depth camera capable of extracting depth information using infrared (IR) light. In this case, the application processor 1200 may generate a three-dimensional (3D) depth image by merging image data provided by the camera module 1100c and image data provided by the other camera modules, i.e., the camera modules 1100a and 1100b.

In some embodiments, at least two of the camera modules 1100a, 1100b, and 1100c may have different fields of view. In this case, at least two of the camera modules 1100a, 1100b, and 1100c, for example, the camera modules 1100a and 1100b, may have different optical lenses, but the inventive concept is not limited thereto.

Also, in some embodiments, the camera modules 1100a, 1100b, and 1100c may have different fields of view. In this case, the camera modules 1100a, 1100b, and 1100c may have different optical lenses, but the inventive concept is not limited thereto.

In some embodiments, the camera modules 1100a, 1100b, and 1100c may be disposed to be physically separate from one another. That is, the camera modules 1100a, 1100b, and 1100c may not share the sensing area of a single image sensor 1142 together, but independent image sensors 1142 may be disposed in the camera modules 1100a, 1100b, and 1100c.

Referring to FIG. 10, the application processor 1200 may include an image processor 1210, a memory controller 1220, and an internal memory 1230. The application processor 1200 may be implemented as being separate from the camera modules 1100a, 1100b, and 1100c. For example, the application processor 1200 and the camera modules 1100a, 1100b, and 1100c may be implemented as separate semiconductor chips.

The image processor 1210 may include a plurality of sub-image processors 1212a, 1212b, and 1212c, an image generator 1214, and a camera module controller 1216.

The image processor 1210 may include as many sub-image processors as there are camera modules (e.g., sub-image processors 1212a, 1212b, and 1212c corresponding to the camera modules 1100a, 1100b, and 1100c, respectively).

Image data generated by the camera modules 1100a, 1100b, and 1100c may be provided to the sub-image processors 1212a, 1212b, and 1212c via image signal lines ISLa, ISLb, and ISLb, which are separate from one another. For example, the image data generated by the camera module 1100a may be provided to the sub-image processor 1212a via the image signal line ISLa, the image data generated by the camera module 1100b may be provided to the sub-image processor 1212b via the image signal line ISLb, and the image data generated by the camera module 1100c may be provided to the sub-image processor 1212c via the image signal line ISLc. The transmission of the image data may be performed via, for example, a mobile industry processor interface (MIPI)-based camera serial interface (CIS), but the inventive concept is not limited thereto.

In some embodiments, a single sub-image processor may be disposed to correspond to multiple camera modules. For example, the sub-image processors 1212a and 1212c may be incorporated into a single integrated sub-image processor, and the image data provided by the camera module 1100a or the image data provided by the camera module 1100c may be selected by a selection element (e.g., a multiplexer) and may then be provided to the integrated sub-image processor.

The image data provided to each of the sub-image processors 1212a, 1212b, and 1212c may be provided to the image generator 1214. The image generator 1214 may generate an output image using the image data provided thereto from each of the sub-image processors 1212a, 1212b, and 1212c, in accordance with image generating information "generating information" or a mode signal "Mode Signal".

Specifically, the image generator 1214 may generate an output image by merging at least some of the image data provided by the camera modules 1100a, 1100b, and 1100c, which have different fields of view, in accordance with the image generating information "generating information" or the mode signal "Mode Signal". Also, the image generator 1214 may generate an output image by selecting one of the image data generated by the camera modules 1100a, 1100b, and 1100c, which have different fields of view, in accordance with the image generating information "generating information" or the mode signal "Mode Signal".

In some embodiments, the image generating information "generating information" may include a zoom signal or a zoom factor. In some embodiments, the mode signal "Mode Signal" may be, for example, a signal based on a mode selected by a user.

In a case where the image generating information "generating information" is a zoom signal or a zoom factor and the camera modules 1100a, 1100b, and 1100c have different fields of view, the image generator 1214 may perform different operations depending on the type of zoom signal. For example, if the zoom signal is a first signal, the image data provided by the camera module 1100a and the image data provided by the camera module 1100c may be merged together, and an output image may be generated using the merged image data and the image data provided by the camera module 1100b, and if the zoom signal is a second signal, which is different from the first signal, one of the image data provided by the camera module 1100a, the image data provided by the camera module 1100b, and the image data provided by the camera module 1100c may be chosen, and an output image may be generated using the chosen image data. However, the scope of the inventive concept is not limited thereto, and the method to generating process image data may vary.

In some embodiments, the image generator 1214 may receive image data having different exposure times from at least one of the sub-image processors 1212a, 1212b, and 1212c and may perform high-dynamic range processing on the image data, thereby generating merged image data with an enhanced dynamic range.

The camera module group 1100 may include the image sensing apparatus 200 of FIG. 1.

The ISP 100 of FIG. 1 may be implemented inside the camera module group 1100 of FIG. 11, in the sub-image processors 1212a, 1212b, and 1212c of FIG. 10, or in the image generator 1214 of FIG. 10.

The camera module controller 1216 may provide control signals to the camera modules 1100a, 1100b, and 1100c. The control signals provided by the camera module controller 1216 may be provided to the camera modules 1100a, 1100b, and 1100c via the control signal lines CSLa, CSLb, and CSLc, which are separate from one another.

One of the camera modules 1100a, 1100b, and 1100c, for example, the camera module 1100b, may be designated as a master camera in accordance with the mode signal "Mode Signal" or the image generating information "Generating Information", which includes a zoom signal, and the other camera modules, i.e., the camera modules 1100a and 1100c, may be designated as slave cameras. This type of information may be included in a control signal and may then be provided to the camera modules 1100a, 1100b, and 1100c via the control signal lines CSLa, CSLb, and CSLc, which are separate from one another.

Master and slave camera modules may be changed in accordance with a zoom factor or the mode signal "Mode Signal". For example, if the camera module 1100a has a wider field of view, but a zoom ratio with a smaller zoom factor, than the camera module 1100b, the camera module 1100b may operate as a master, and the camera module 1100a may operate as a slave. In contrast, if the camera module 1100a has a zoom ratio with a greater zoom factor than the camera module 1100b, the camera module 1100a may operate as a master, and the camera module 1100b may operate as a slave.

In some embodiments, the control signals provided from the camera module controller 1216 to the camera modules 1100a, 1100b, and 1100c may include a sync enable signal. For example, if the camera module 1100b is a master camera and the camera modules 1100a and 1100c are slave cameras, the camera module controller 1216 may transmit the sync enable signal to the camera module 1100b. The camera module 1100b may receive the sync enable signal, may generate a sync signal based on the sync enable signal, and may provide the sync signal to the camera modules 1100a and 1100c via the sync signal lines SSL. The camera modules 1100a, 1100b, and 1100c may transmit image data to the application processor 1200 in synchronization with the sync signal.

In some embodiments, the control signals provided from the camera module controller 1216 to the camera modules 1100a, 1100b, and 1100c may include mode information corresponding to the mode signal "Mode Signal" provided to the camera modules 1100a, 1100b, and 1100c. The camera modules 1100a, 1100b, and 1100c may operate in one of first second operating modes, which are associated with the speed of sensing, in accordance with the mode information.

In the first operating mode, the camera modules 1100a, 1100b, and 1100c may generate an image signal at a first speed (i.e., generate an image signal of a first frame rate), may encode the image signal at a second speed, which is higher than the first speed (i.e., encode the image signal at a second frame rate, which is higher than the first frame rate), and may transmit the encoded image signal to the application processor 1200. Here, the second speed may be less than 30 times the first speed.

The application processor 1200 may store a received image signal, i.e., an encoded image signal, in the internal memory 1230 or in the external memory 1400, may read and decode the encoded image signal from the internal memory 1230 or the external memory 1400, and may display image data generated based on the decoded image signal. For example, the decoding of the encoded image signal may be performed by the sub-processors 1212a, 1212b, and 1212c of the image processing apparatus 1210, and image processing may be performed on the decoded image signal.

In the second operating mode, the camera modules 1100a, 1100b, and 1100c may generate an image signal at a third speed, which is lower than the first speed (i.e., generate an image signal of a third frame rate, which is lower than the first frame rate) and may transmit the image signal to the application processor 1200. The image signal transmitted to the application processor 1200 may be a non-encoded signal. The application processor 1200 may perform image processing on the image signal received from the camera modules 1100a, 1100b, and 1100c or may store the received image signal in the internal memory 1230 or the external memory 1400.

The PMIC 1300 may supply power, for example, a power supply voltage, to the camera modules 1100a, 1100b, and 1100c. For example, the PMIC 1300 may supply first power to the camera module 1100a via a power signal line PSLa, second power to the camera module 1100b via a power signal line PSLb, and third power to the camera module 1100c via a power signal line PSLc, under the control of the application processor 1200.

The PMIC 1300 may generate power corresponding to each of the camera modules 1100a, 1100b, and 1100c and control the level of the power in response to a power control signal PCON from the application processor 1200. The power control signal PCON may include power control signals for different operating modes of the camera modules 1100a, 1100b, and 1100c. For example, the operating modes of the camera modules 1100a, 1100b, and 1100c may include a low power mode, in which case, the power control signal PCON may include information indicating which camera module is to operate in the low power mode and information indicating the level of power to be set. The level of power provided may be the same for all the camera modules 1100a, 1100b, and 1100c or may differ from one camera module to another camera module. Also, the level of power provided may be dynamically changed.

While the inventive concept has been shown and described with reference to several illustrated embodiments, those skilled in the art will appreciate that various changes in form and details may be made therein without departing from the spirit and scope of the inventive concept as defined by the appended claims and their equivalents.

What is claimed is:

1. An image sensor comprising:
   a pixel array disposed in a Bayer pattern and including pixels which respectively generate an electrical charge according to incident light; and
   an analog logic configured to:
   convert an analog signal output from at least one pixel among the pixels into a first digital code consisting of N-bits using analog-to-digital conversion, where N is a positive integer;
   receive a control signal;
   generate a second digital code consisting of N-k bits by eliminating k low-order bits of the first digital code in response to the control signal, where k is an integer less than N and greater than zero, wherein the N-k bits of the second digital code are the same as N-k high-order bits of the first digital code and k is variably controlled by the control signal,
   wherein the analog logic includes:
   an analog digital converter (ADC) controller configured to generate the control signal in response to a gain adjust signal; and
   an analog digital converter (ADC) configured to adjust an analog gain in response to the control signal and amplify the analog signal using the analog gain, wherein the analog logic determines k based on a signal level of the analog signal and a level of the gain adjust signal,
   wherein the image sensor further comprises a digital logic configured to receive the second digital code and receive the control signal from the ADC controller, the digital logic including a random bit generator configured to generate k number of random bits based on the control signal, and
   wherein the digital logic is configured to combine the second digital code with the k number of random bits to generate a third digital code, the third digital code being represented by the same number of bits as the first digital code.

2. The image sensor of claim 1, wherein
   the analog digital converter (ADC) controller configured to generate the control signal in response to the gain adjust signal and a user input signal.

3. The image sensor of claim 2, wherein the analog logic further includes:
   a bit shifter configured to shift-out the k low-order bits of the first digital code according to the control signal and output remaining N-k high-order bits as the second digital code, and
   the first digital code includes the low-order bits and the remaining N-k high-order bits.

4. The image sensor of claim 2, wherein:
   the gain adjust signal adjusts the analog gain of the ADC, and
   the user input signal determines k.

5. The image sensor of claim 1, wherein:
   the image sensor is included in an image sensing device; and
   the image sensing device includes:
   a controller configured to control operation of the image sensor;
   a memory configured to store information associated with the operation of the image sensing device; and
   a storage part configured to store image data sensed by the image sensor.

6. The image sensor of claim 1, wherein k is variably determined according to a color or a position of the at least one pixel within the Bayer pattern.

7. A method of operating an image sensing device, the method comprising:
   generating an analog signal corresponding to an electrical charge generated by at least one pixel in response to incident light;
   converting the analog signal from an output line of the at least one pixel to generate a first digital code consisting of N-bits, where N is a positive integer;
   receiving a control signal including a gain adjust signal for adjusting an analog gain of an analog digital converter (ADC); and
   eliminating k low-order bits of the first digital code in response to the control signal to generate a second digital code consisting of N-k bits, where k is an integer less than N and greater than zero and k is determined based on a signal level of the analog signal and a level of the gain adjust signal, wherein the N-k bits of the second digital code are the same as N-k high-order bits of the first digital code;

generating k number of random bits based on the control signal; and outputting a third digital code by appending the k number of random bits to the second digital code such that the k number of random bits constitute lowest-order bits of the third digital code, wherein the third digital code is represented by the same number of bits as the first digital code.

8. The method of claim 7, wherein the first-control signal further includes a user input signal determining k.

9. The method of claim 7, wherein the analog signal is amplified with a gain adjusted according to the gain adjust signal.

10. The method of claim 7, wherein k is variably determined according to a color or a position of the at least one pixel among pixels within a Bayer pattern.

11. The method of claim 7, wherein k is variably determined from a user input signal.

12. An image sensor comprising:

an image device that generates an analog signal in response to received light;

an analog logic configured to:

generate a first digital code consisting of N bits representing the analog signal, wherein N is a positive integer;

receive a control signal; and generate a second digital code consisting of N-k bits by eliminating k low-order bits of the first digital code in response to the control signal including a gain adjust signal for adjusting an analog gain of an analog digital converter (ADC), wherein the N-k bits of the second digital code are the same as N-k high-order bits of the first digital code; and a digital logic configured to receive the second digital code and receive the control signal from the analog logic, the digital logic including a random bit generator configured to generate k number of random bits based on the control signal, wherein the digital logic is configured to combine the second digital code with the k number of random bits to generate a third digital code, the third digital code being represented by the same number of bits as the first digital code.

13. The image sensor of claim 12, wherein the analog logic amplifies the analog signal in accordance with the gain adjust signal.

14. The image sensor of claim 12, wherein k is variably determined according to a color or a position of a pixel within the image device that generates an analog signal.

15. The image sensor of claim 12, wherein k is increasing as the analog gain of the ADC is increasing.

16. The image sensor of claim 12, wherein k is increasing as N is increasing.

* * * * *